(12) United States Patent
Saly et al.

(10) Patent No.: US 12,018,363 B2
(45) Date of Patent: Jun. 25, 2024

(54) GAP-FILL WITH ALUMINUM-CONTAINING FILMS

(71) Applicant: Applied Materials, Inc., Santa Clara, CA (US)

(72) Inventors: Mark Saly, Santa Clara, CA (US); Lakmal C. Kalutarage, San Jose, CA (US); Jeffrey W. Anthis, San Jose, CA (US); Tatsuya E. Sato, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 765 days.

(21) Appl. No.: 16/577,220

(22) Filed: Sep. 20, 2019

(65) Prior Publication Data

US 2020/0095674 A1    Mar. 26, 2020

Related U.S. Application Data

(60) Provisional application No. 62/734,625, filed on Sep. 21, 2018.

(51) Int. Cl.
| | |
|---|---|
| *C23C 16/30* | (2006.01) |
| *C23C 16/32* | (2006.01) |
| *C23C 16/455* | (2006.01) |
| *C23C 16/50* | (2006.01) |
| *C23C 16/56* | (2006.01) |
| *C23F 1/44* | (2006.01) |
| *H01L 21/02* | (2006.01) |

(Continued)

(52) U.S. Cl.
CPC ............ *C23C 16/303* (2013.01); *C23C 16/32* (2013.01); *C23C 16/56* (2013.01); *C23F 1/44* (2013.01); *H01L 21/02274* (2013.01); *H01L 21/76224* (2013.01); *H01L 21/76837* (2013.01); *C23C 16/45536* (2013.01); *C23C 16/50* (2013.01)

(58) Field of Classification Search
CPC ....... C23C 16/303; C23C 16/32; C23C 16/56; C23C 16/45536; C23C 16/50; C23F 1/44; H01L 21/02274; H01L 21/76224; H01L 21/76837
See application file for complete search history.

(56) References Cited

U.S. PATENT DOCUMENTS

| | | |
|---|---|---|
| 6,143,659 A | 11/2000 | Leem |
| 6,620,670 B2 | 9/2003 | Song et al. |
| 6,759,081 B2 | 7/2004 | Huganen et al. |

(Continued)

FOREIGN PATENT DOCUMENTS

WO    WO-2017171760 A1 * 10/2017 ......... H01L 21/0337

OTHER PUBLICATIONS

"Aluminum Oxide" (https://accuratus.com/alumox.html copyright 2013, accessed online Jan. 15, 2022) (Year: 2013).*

(Continued)

*Primary Examiner* — Michael G Miller
(74) *Attorney, Agent, or Firm* — Servilla Whitney LLC

(57) ABSTRACT

Methods for depositing film comprise depositing an aluminum-containing gap-fill film in a bottom-up manner in a feature of a substrate surface. The substrate can be sequentially exposed to an aluminum-containing precursor, a reactant, a fluorinating agent, and an etchant any number of times to promote bottom-up growth of the film in the feature.

20 Claims, 9 Drawing Sheets

(51) Int. Cl.
*H01L 21/762* (2006.01)
*H01L 21/768* (2006.01)

(56) References Cited

U.S. PATENT DOCUMENTS

| | | | |
|---|---|---|---|
| 6,867,152 | B1 | 3/2005 | Hausmann et al. |
| 7,141,500 | B2 | 11/2006 | Jursich et al. |
| 7,271,112 | B1 | 9/2007 | Papasouliotis et al. |
| 8,013,401 | B2 | 9/2011 | Lavoie et al. |
| 8,088,685 | B2 | 1/2012 | Lin et al. |
| 8,187,486 | B1 * | 5/2012 | Liu .................... H01L 21/0206 438/723 |
| 10,037,884 | B2 | 7/2018 | Ou et al. |
| 2009/0127648 | A1 * | 5/2009 | Chen ................. H01L 21/76232 257/506 |
| 2012/0064715 | A1 | 3/2012 | Lin et al. |
| 2015/0255324 | A1 * | 9/2015 | Li .................... C23C 16/45551 438/778 |
| 2017/0140983 | A1 | 5/2017 | Leschkies et al. |
| 2018/0005801 | A1 | 1/2018 | Singhal et al. |
| 2018/0237912 | A1 | 8/2018 | Takahashi et al. |
| 2019/0055654 | A1 * | 2/2019 | George .................... C23F 4/00 |
| 2019/0096666 | A1 * | 3/2019 | Zhou .................. H01L 21/0337 |

OTHER PUBLICATIONS

Li ("Trimethylaluminum as the Metal Precursor for the Atomic Layer Etching of Al2O3 Using Sequential, Self-Limiting Thermal Reactions", Lee et al, Chem. Mater. 2016, 28, 2994-3003, accessed online Jan. 15, 2022) (Year: 2016).*
Lee, Younghee , et al., "Atomic Layer Deposition of AlF3 Using Trimethylaluminum and Hydrogen Fluoride", The Journal of Physical Chemistry—ACS Publications, May 27, 2015, 14185-14194.
PCT International Search Report and Written Opinion in PCT/US2019/052095 dated Jan. 6, 2020, 11 pages.

* cited by examiner

GAP-FILL WITH ALUMINUM-CONTAINING FILMS

CROSS-REFERENCE TO RELATED APPLICATIONS

This application claims priority to U.S. Provisional Application No. 62/734,625, filed Sep. 21, 2018, the entire disclosure of which is hereby incorporated by reference herein.

TECHNICAL FIELD

The present disclosure relates generally to methods of depositing thin films. In particular, the disclosure relates to gap-fill processes for filling narrow trenches.

BACKGROUND

In microelectronics device fabrication there is a need to fill narrow trenches having aspect ratios (AR) of approximately 5:1 or greater with no voiding for many applications. One application is patterning. Other applications include but are not limited to: memory capacitors (DRAM, Flash Memory, ReRAM, MIM capacitors), dielectric film used to control switching gates (transistor), optical function films (optical isolation) and mechanical film to support electrical circuit structure (dummy gate).

Aluminum oxide and other aluminum-based films such as aluminum nitride have low dry etch rates compared to typical dielectric films such as SiO, SiN, SiCN, and Si.

There is a need for methods that can utilize aluminum-based films for gap-fill, resulting in bottom up-film growth where the as-deposited film is of high quality with minimized to no voiding.

SUMMARY

One or more embodiments of the disclosure are directed to processing method comprising depositing an aluminum-containing gap-fill film in a feature of a substrate surface, the feature extending a depth from the substrate surface to a bottom surface, the at least one feature having a width defined by a first sidewall and a second sidewall. A film is deposited in a bottom-up manner.

Additional embodiments of the disclosure are directed to processing methods comprising: positioning a substrate surface in a processing chamber. The substrate surface has at least one feature thereon. The at least one feature creates a gap with a bottom, top and sidewalls. The substrate surface is exposed to an aluminum-containing precursor and a reactant to form a conformal aluminum-containing film on the substrate surface. The substrate surface is exposed to a fluorinating agent and an etchant to preferentially etch the conformal aluminum-containing film at the top of the feature relative to the bottom of the feature. The substrate surface is optionally exposed to an oxidizing agent after the preferential etch. The sequential exposure to the precursor and reactant followed by exposure to the fluorinating agent and etchant and optional oxidizing agent to fill the gap of the feature in a bottom-up manner.

Further embodiments of the disclosure are directed to processing methods comprising: placing a substrate having a substrate surface into a processing chamber comprising a plurality of sections, each section separated from adjacent sections by a gas curtain, the substrate surface having at least one feature with a top, bottom and sides and an aspect ratio of greater than or equal to 10:1. At least a portion of the substrate surface is exposed to a first process condition in a first section of the processing chamber, the first process condition comprising an aluminum-containing precursor. The substrate surface is laterally moved through a gas curtain to a second section of the processing chamber. The substrate surface is exposed to a second process condition in the second section of the processing chamber, the second process condition comprising a reactant to form a film with the aluminum-containing precursor, the film comprising a species according to $AlC_xO_yN_z$, wherein x, y, and z are independently in the range of 0-3. The substrate surface is laterally moved through a gas curtain to a third section of the processing chamber. The substrate surface is exposed to a third process condition in the third section of the processing chamber, the third process condition comprising a fluorinating agent. The substrate surface is moved through a gas curtain to a fourth section of the processing chamber. The substrate surface is exposed to a fourth process condition in the fourth section of the processing chamber, the fourth process condition comprising an etchant. The substrate surface is optionally moved through a gas curtain to a fifth section of the processing chamber. The substrate surface is optionally exposed to a fifth process condition in the fifth section of the processing chamber, the fifth process condition comprising an oxidizing agent. Exposure to the first section, second section, third section, fourth section, and optionally to the fifth section including lateral movement of the substrate surface is repeated to fill the feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
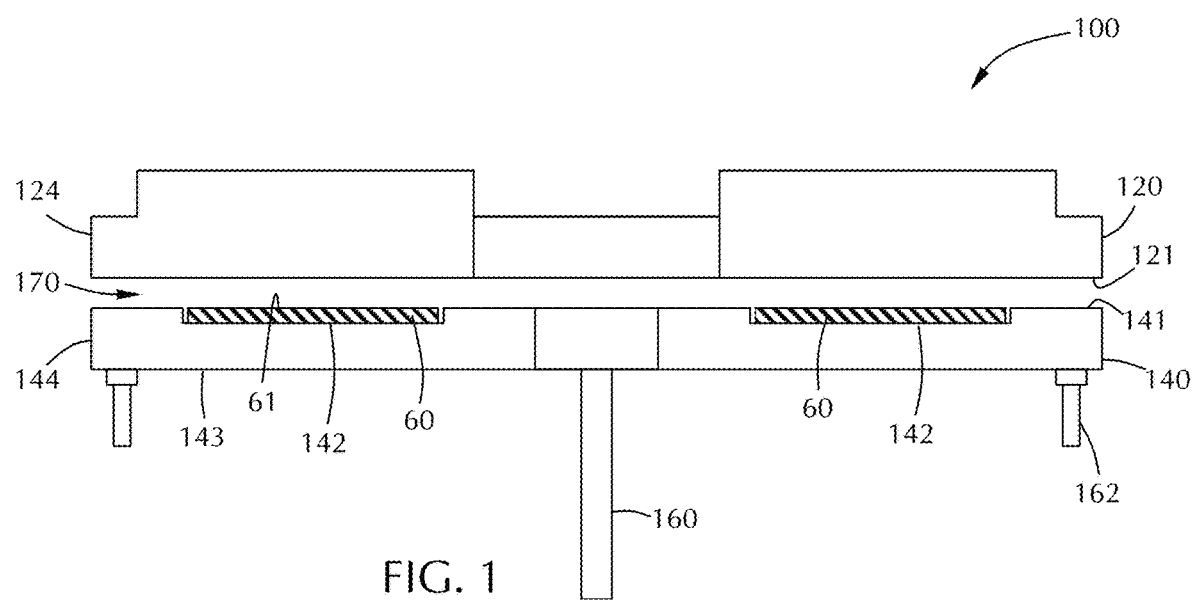
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Aluminum oxide (AlO) is used for patterning applications. AlO has a low dry etch rate compared to typical dielectric films such as SiO, SiN, SiCN, and Si. Therefore, AlO has favorable etch selectivity compared to other films for the purposes of bottom-up gap-fill of a feature of a substrate. In addition to AlO, suitable gap-fill films include species that include but are not limited to: AlN, AlC, AlCN, metallic Al, and the like, generally referred to as $AlC_xO_yN_z$, wherein x, y, and z are independently in the range of 0-3 according to the property of atomic species. As will be understood by those skilled in the art, $AlC_xO_yN_z$, wherein x, y, and z is independently in the range of 0-1, is not intended to be stoichiometric, rather representative of the atomic composition. For example, a stoichiometric film $Al_2O_3$ could be referred to as $AlC_0O_{1.5}N_0$. Such films may also be referred to by atomic composition—rather than stoichometric—as aluminum carbide, aluminum oxide, aluminum nitride, aluminum oxycarbide, aluminum oxynitride, aluminum carbonitride and/or aluminum oxycarbonitride.

One or more embodiments of the disclosure are directed to processing methods comprising depositing an aluminum-containing gap-fill film in a bottom-up manner in a feature on a substrate. As used in this regard, the term "bottom-up manner" means that a film is deposited preferentially in the bottom of the feature relative to the top of the feature. The methods herein are directed to non-conformal etching, where the etch rate is higher at the top of the feature than at the bottom of the feature.

One or more embodiments of the disclosure are directed to methods to preferentially etch the top of the feature relative to the bottom of the feature followed by film deposition in order to grow the film in a bottom up manner. Some embodiments of the disclosure provide methods that advantageously fill features with aspect ratios of greater than 5:1 or even 10:1 with a film. One or more embodiments of the disclosure advantageously provide methods of gap-filling features with high throughput and repeatability.

According to one or more embodiments, the method uses a chemical vapor deposition (CVD) process. In such embodiments, the substrate surface is exposed to a first reactive gas and a second reactive gas at the same time so that the first reactive gas and the second reactive gas mix during formation of the film.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reactant, although there may be some overlap. As used in this specification and the appended claims, the terms "precursor", "reactant", "reactive gas" and the like are used interchangeably to refer to any gaseous species that can react with the substrate surface, or a species present on the substrate surface.

In one or more embodiments, the gap-fill method is performed using an Atomic Layer Deposition (ALD) process. An ALD process is a self-limiting process where a single layer of material is deposited using a binary (or higher order) reaction. An individual ALD reaction is theoretically self-limiting continuing until all available active sites on the substrate surface have been reacted. ALD processes can be performed by time-domain or spatial ALD.

In a time-domain process, the processing chamber and substrate are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial ALD process, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
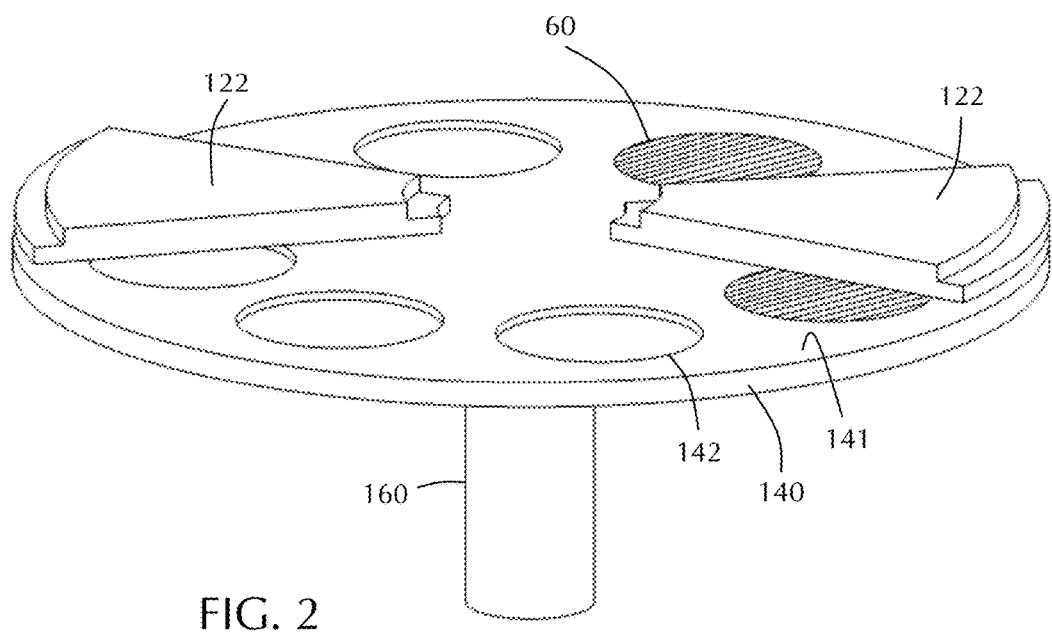
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
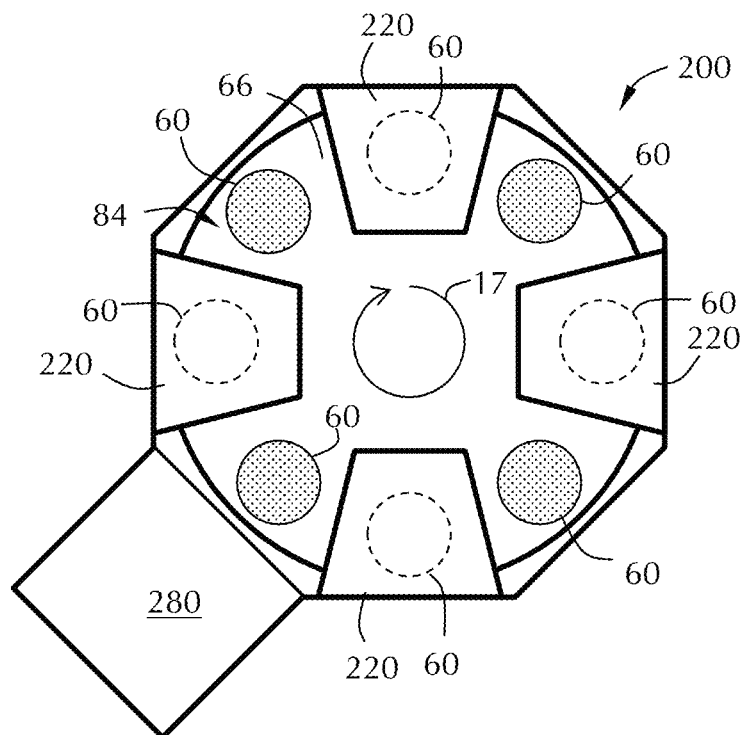
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
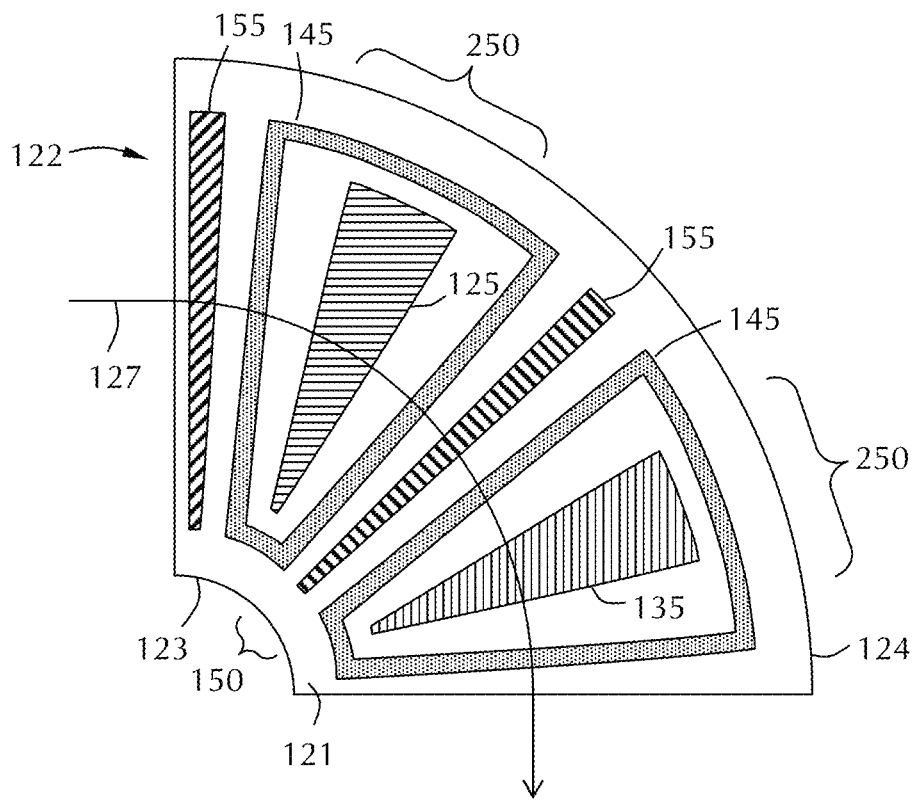
FIG. 4 shows a schematic view of a portion of a wedge shaped gas distribution assembly for use in a batch processing chamber in accordance with one or more embodiment of the disclosure.
Figure 5:
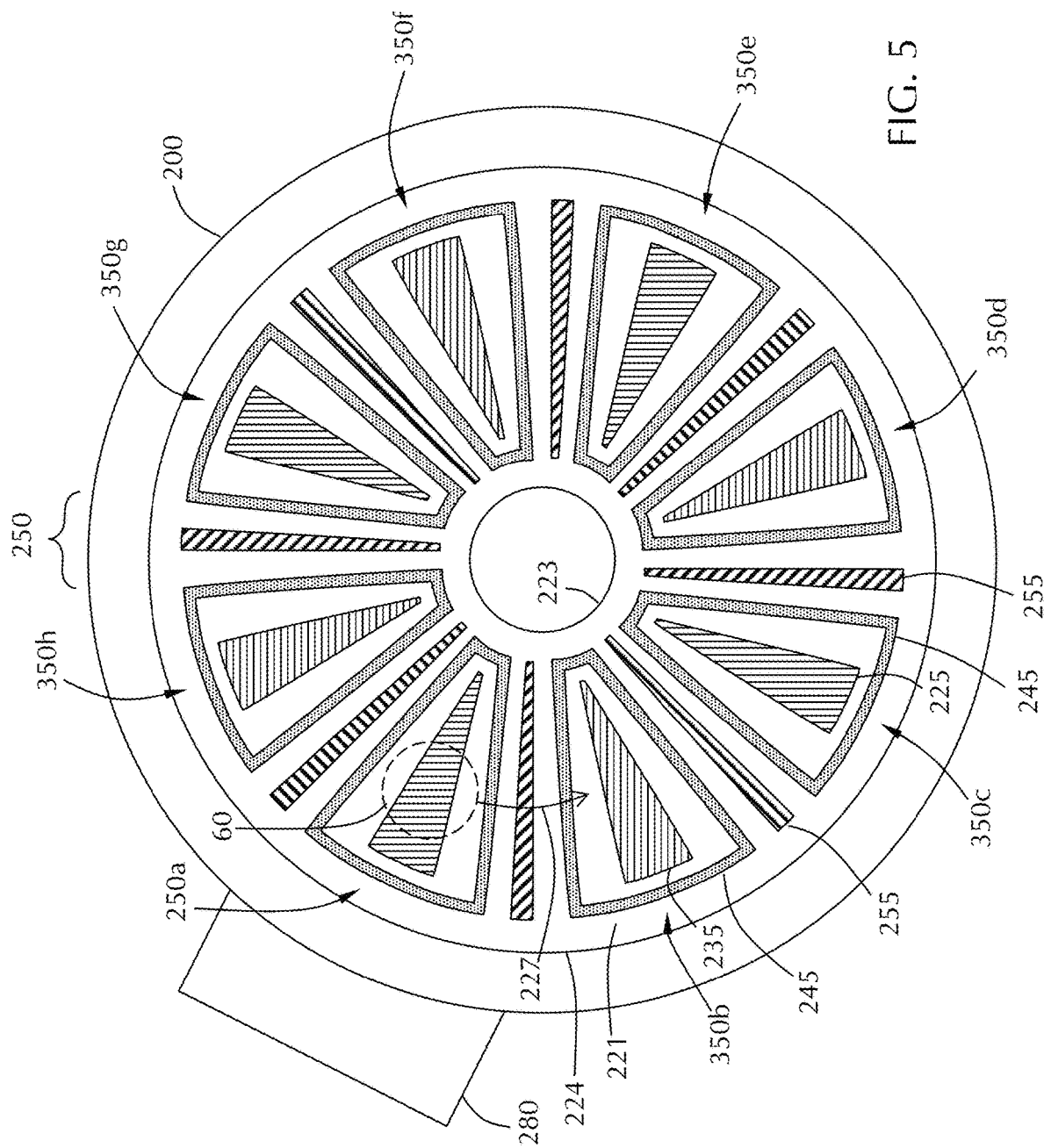
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions 250 are roughly defined around the individual gas ports 125, 135 with the gas curtain 150 between the processing regions 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150*b*. Rotating the substrate 60 along path 127 will move the substrate counter-clockwise around the processing chamber 100. Thus, the substrate 60 will be exposed to the first processing region 250*a* through the eighth processing region 250*h*, including all processing regions between.

Embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250*b* through processing region 250*h*, an inert gas would be flowing into processing region 250*a*. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Figure 6:
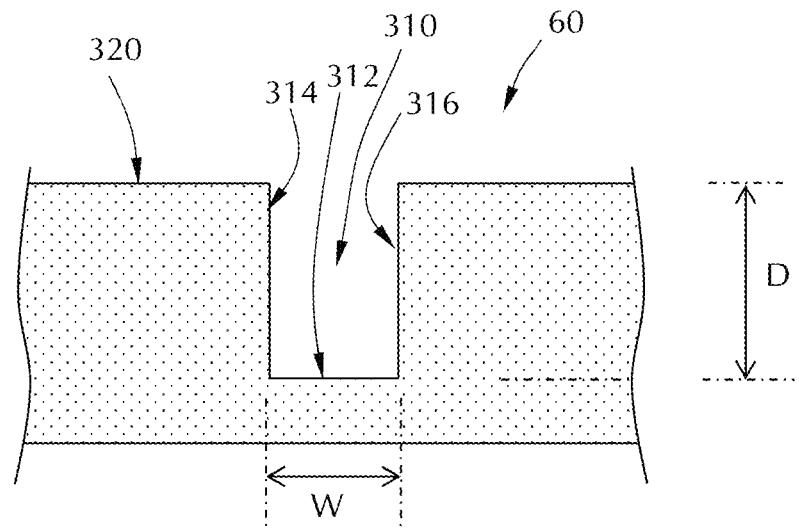
FIG. 6 shows a cross-sectional view of a substrate feature in accordance with one or more embodiments of the disclosure.

FIG. 6 shows a partial cross-sectional view of a substrate 60 with a feature 310. The Figures show substrates having a single feature for illustrative purposes; however, those skilled in the art will understand that there can be more than one feature. The shape or profile of the feature 310 can be any suitable shape or profile including, but not limited to, (a) vertical sidewalls and bottom surface, (b) tapered sidewalls, (c) under-cutting, (d) reentrant profile, (e) bowing, (f) microtrenching, (g) curved bottom surface, and (h) notching. As used in this regard, the term "feature" means any intentional surface irregularity. Suitable examples of features include, but are not limited to trenches and holes which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 60 has a substrate surface 320. The at least one feature 310 forms an opening in the substrate surface 320. The feature 310 extends from the substrate surface 320 to a depth D to a bottom surface 312. The feature 310 has a first sidewall 314 and a second sidewall 316 that define a width W of the feature 310. The open area formed by the sidewalls and bottom are also referred to as a gap.

Figure 7:
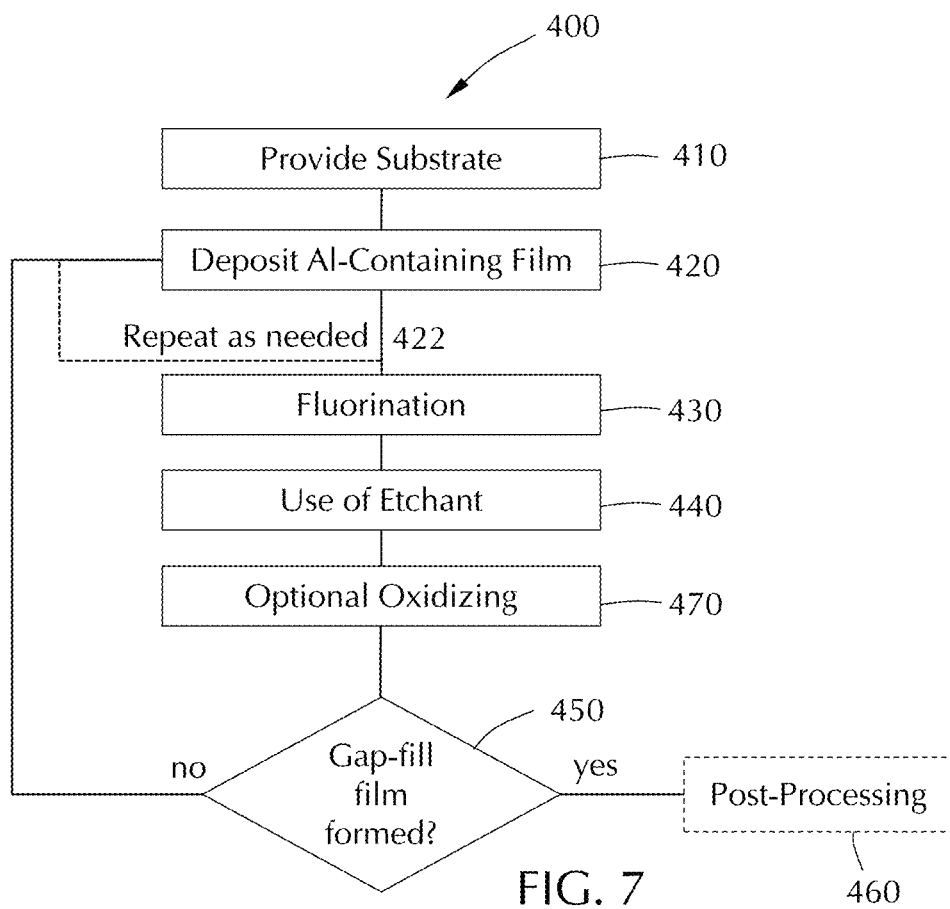
FIG. 7 shows a process flow diagram of a bottom-up gap-fill process in accordance with one or more embodiments of the disclosure.

FIG. 7 shows a process flow diagram of a bottom-up gap-fill process of an aluminum-containing film 400 in accordance with one or more embodiments of the disclosure. With reference to FIGS. 7 and 8A through 8E, the substrate 60 is provided for processing at 410. As used in this regard, the term "provided" means that the substrate is placed into a position or environment for further processing. At 420, an Al-containing film 330 is deposited on the substrate surface 320 and the sidewalls 314, 316 and bottom 312 of the feature 310. Formation of the Al-containing film 330 comprises sequentially exposing the substrate surface to an aluminum-containing precursor and a reactant. Deposition 420 may be repeated as needed in direct succession 422. Also, deposition 420 is repeated after use of the etchant 440 until the gap-fill film is formed. In one or more embodiments, the depth and width of the feature is filled without voids or seams. According to one or more embodiments, the aluminum-containing gap-fill film has a thickness in the range of about 10 Å to about 10000 Å.

The Al-containing film 330 formed can be any suitable film. In some embodiments, the Al-containing film 330 formed is an amorphous or crystalline aluminum-containing film comprising one or more species according to $AlC_xO_yN_z$ (I), wherein x, y, and z are independently in the range of 0-3 according to the property of atomic species, where the formula is representative of the atomic composition, not stoichiometric. This formula includes: AlO, AlN, AlC, AlON, AlOC, AlCN, AlOCN, metallic Al, and the like The film can be formed by any suitable process including, but not limited to, chemical vapor deposition (CVD), plasma-enhanced chemical vapor deposition (PECVD), atomic layer deposition (ALD), and plasma-enhanced atomic layer deposition (PEALD). Precursors of aluminum may be any volatile aluminum source. Suitable aluminum precursors include, but are not limited to, $AlR_3$, where R= is any ligand bonded to the Al by C, N, O, H, S, or halide. For example, an aluminum precursor may comprise one or more of the following: an alkyl-containing aluminum compound, an aluminum alkoxide-based compound, an aluminum amino-based compound, an aluminum halide, or combinations thereof. In an embodiment, the aluminum precursor is trimethylaluminum (TMA). The precursor may be heated in a hot can to increase the vapor pressure and be delivered to the chamber using a carrier gas (e.g., ultrahigh purity (UHP) Ar, He, $H_2$, N2, etc.). The reactant may comprise an oxygen source, a nitrogen source, a carbon source, a hydrogen source, or combinations thereof. The reactant may be selected from the group consisting of: $O_2$, $O_2$ plasma, NO, NO plasma, $N_2O$, $N_2O$ plasma, $H_2O$, $H_2O$ plasma, $D_2O$, $O_3$, $NH_3$, $NH_3$ plasma, $N_2$, $N_2$ plasma, hydrazine, $CO_2$, $C_1$-$C_6$ hydrocarbons, $H_2$, $H_2$ plasma, methanol, ethanol, isopropanol, or the Al-precursor.

Figure 8A:
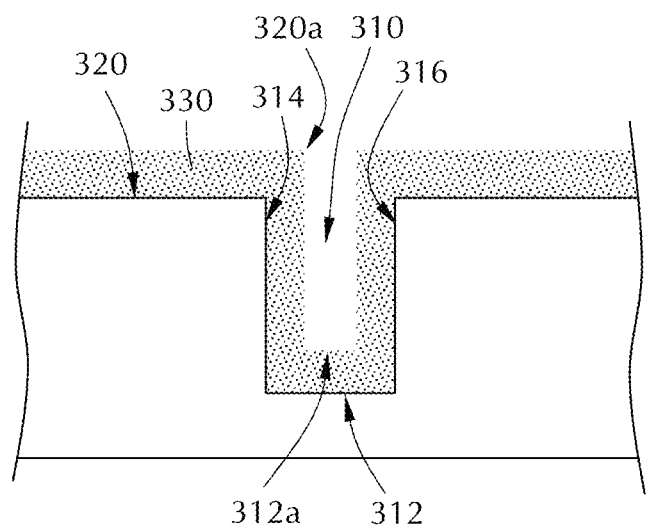
FIGS. 8A through 8F show a gap-fill process in accordance with one or more embodiments of the disclosure.
Figure 8B:
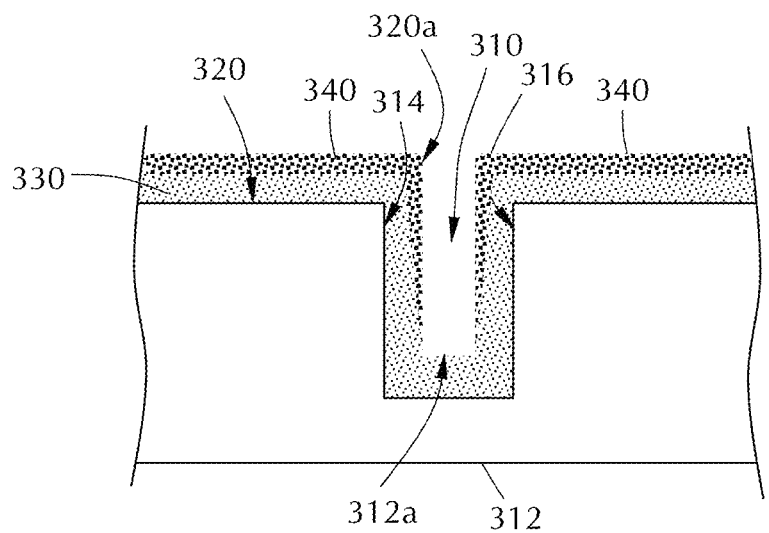

In some embodiments, the Al-containing film 330 forms conformally on at least the one feature 310, and as shown in FIGS. 8A-B, defining a top surface 320*a* and a bottom surface 312 of the feature 310 after the Al-containing film 330 has been formed on the feature 310. As used herein, the term "conformal", or "conformally", refers to a layer that adheres to and uniformly covers exposed surfaces with a thickness having a variation of less than 5% relative to the average thickness of the film. For example, a 1,000 Å thick film would have less than 50 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the Al-containing film 330 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

The temperature during deposition 420 can be any suitable temperature depending on, for example, the precursor(s) being used. In some embodiments, the deposition temperature is in the range of about 50° C. to 550° C., or in the range of about 200° C. to about 500° C., or in the range of about 250° C. to about 450° C. The deposition 420 can occur with or without plasma. The plasma can be a capacitively-coupled plasma (CCP) or inductively coupled plasma (ICP) or microwaves and can be a direct plasma or a remote plasma. The processing chamber pressure during deposition 420 can be in the range of about 50 mTorr to 750 Torr, or in the range of about 100 mTorr to about 400 Torr, or in the range of about 1 Torr to about 100 Torr, or in the range of about 6.5 Torr to about 30 Torr.

Typically, fluorine sources alone are not effective to etch Al-containing films. As such, disclosed herein is an etch process that involves: fluorination and use of an etchant. This process results in non-conformal etching, where the etch rate is greater at the top than at the bottom of the feature, e.g., a trench. Fluorination 430 treats the Al-containing film ($AlC_xO_yN_z$; x, y, and z are independently in the range of 0-3) with a fluoride source, also referred to as a fluorinating agent. The fluorinating agent's reactivity should be sufficient to convert the $AlC_xO_yN_z$ to $AlF_3$. The fluorinating agent may comprise a plasma. The plasma may be a directional plasma. The fluorinating agent may comprise $WF_6$, $NF_3$ plasma, $NbF_5$, $XeF_2$, $F_2$, $TiF_4$, hydrogen fluoride (HF), pyridine-HF, alkylamine-HF, a metal halide, or combinations thereof. In an embodiment, the fluorinating agent comprises: $WF_6$, $NF_3$ plasma, $NbF_5$, $XeF_2$, $F_2$, $TiF_4$, alkylamine-HF, a metal halide, HF, or combinations thereof.

According to some embodiments, higher fluorination at the top versus the bottom of a feature is induced by exposing the feature to a plasma fluorination method, such as $NF_3$ plasma. Since plasma inherently has directionality from the presence of ions, when exposing structure having an aspect ratio of 10:1 or greater to the plasma, without intending to be bound by theory, it is expected that there will be more fluorination at the top versus the bottom. Similarly, preferentially fluorinating the top of the feature relative to the bottom of the feature (e.g., using fluorinating precursor starvation) can facilitate non-conformal fluorination and thus results in overall non-conformal etching at the use of etchant 440. If there is more $AlF_3$, as long as the substrate is saturated with the etchant there should be a higher etch at the top then at the bottom.

In some embodiments, non-conformal etch (or non-conformal fluorination) is induced by a thermal fluorination approach (no plasma) where the concentration of the fluorinating molecule is controlled so that there are more fluorination molecules at the top of the trench when compared to the bottom leading to more fluorination at the top and a higher etch rate. In another aspect, the amount of fluorination can also be determined by the substrate temperature (higher the temperature the more fluorination). Fluorination of the Al-containing film 330 comprises exposing the substrate surface to the fluorinating agent, which forms a fluorinated portion 340 on the top surface 320a of the feature as shown in FIG. 8B. The fluorinated portion 340 comprises $AlF_3$.

Figure 8C:
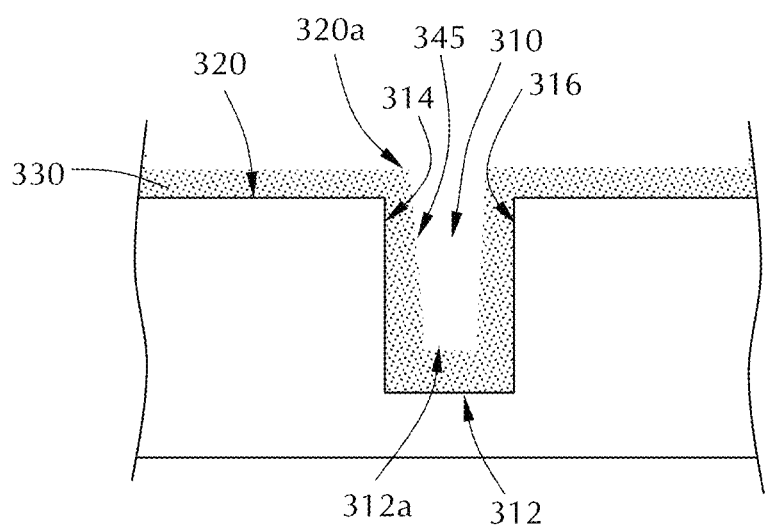

Use of an etchant 440 removes $AlF_3$ from the top surface 320a. Saturating with the etchant assists in removing remaining Al—F bonds. The etchant may be defined as any compound that can react with $AlF_3$ to make volatile AlF species that are removed from the surface. The etchant may be a molecule that transfers some type of ligand (L) to the Al at the surface and form a volatile $L_nAlF_m$ species. Non-limiting examples include trimethylaluminum (TMA) and $Sn(acac)_2$. Aluminum alkyls and some Sn(II) compounds may also be used as the etchant. In one or more embodiments, the etchant may comprise one or more of the following: $R'_3Al$, where R' is an alkyl, an amine, or combinations thereof, for example, trimethylaluminum (TMA); $Sn(R'')_2$, where R'' is acetylacetone (acac), hexafluoroacetylacetone (hfac), and combinations thereof; $Sn(R''')_4$, where R''' is an alkyl, an amine, an ether (e.g., methoxy (OMe), ethyoxy (OE), isopropoxy (OiPr), t-butoxy (Ot-Bu)) or combinations thereof; and $Sn(R'''')_2$, where R'''' is a cyclopentadienyl (Cp)-based ligand. Use of the etchant removes the fluorinated portion and achieves a non-conformally etched surface 345 as shown in FIG. 8C. The non-conformally etched surface 345 has a V-shaped profile. Fluorine residues left on the surface after use of the etchant may be an advantageous poisoning effect, meaning that during subsequent Al-deposition, a non-conformal film may be formed, which favors bottom-up gap-fill.

Figure 9:
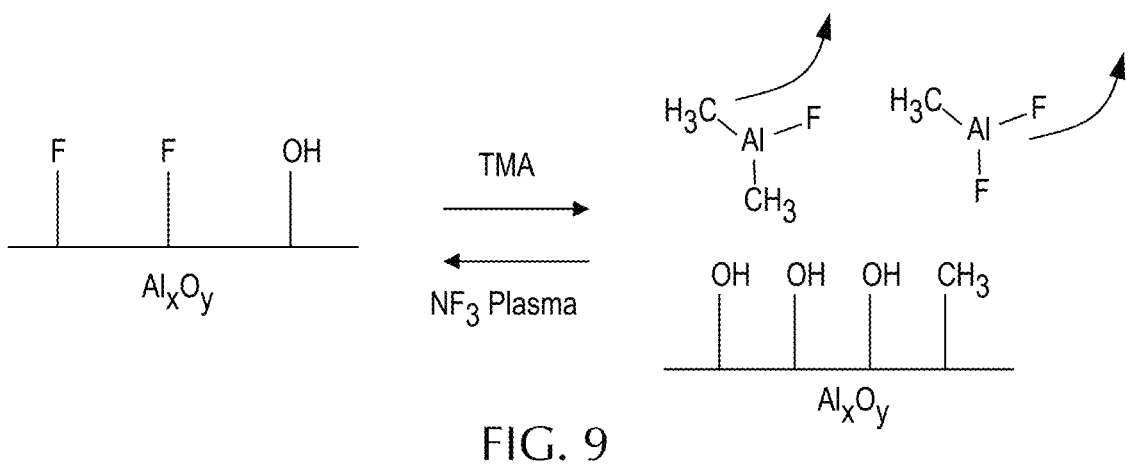
FIG. 9 is a schematic of an etch process from a molecular perspective according to an embodiment.

FIG. 9 is a schematic of an etch process from a molecular perspective according to an embodiment. In this example, $NF_3$ plasma is used as the fluoride source and TMA is used as the aluminum fluoride etchant. The mixed alkyl aluminum fluoride species evolved in this example are not volatile until ~250° C., and therefore there is no etch below 250° C.

After use of the etchant, the film may optionally be exposed to an oxidizing agent to remove Al—F bonds that were not removed by the etchant. Suitable oxidizing chemistries include but are not limited to: ($O_2$ plasma (RPS and Direct), ozone, water, $N_2O$, and any other oxidizing chemistry that will convert any Al—F residues back to Al—O.

Figure 8D:
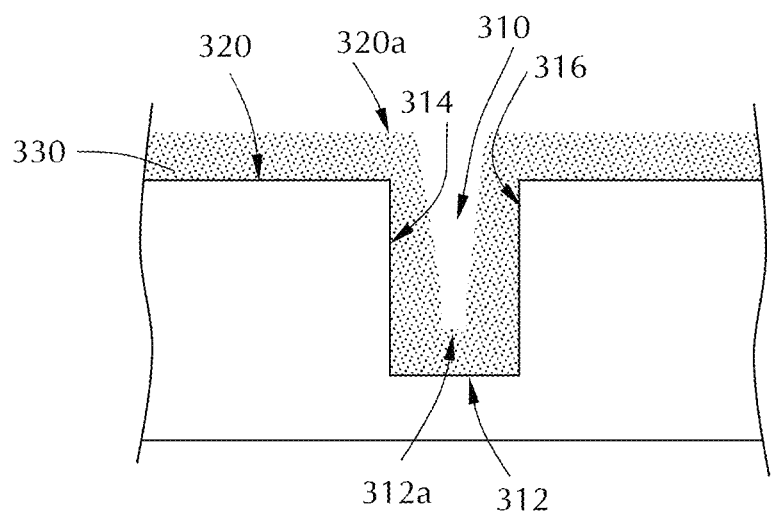

Deposition 420, followed by fluorination 430, use of the etchant 440, and optional oxidizing 470 are repeated if a gap-fill film has not been completely formed. FIG. 8D provides a cross-section view of the gap 310 partially filled by the Al-containing film 330. The process may be defined by (deposition)a→(etch)b, where "a" and "b" are independently the number of deposition cycles and etch cycles, respectively. In one or more embodiments, "a" is in the range of 0 to 1000 and "b" is in the range of 0 to 1000.

Figure 8E:
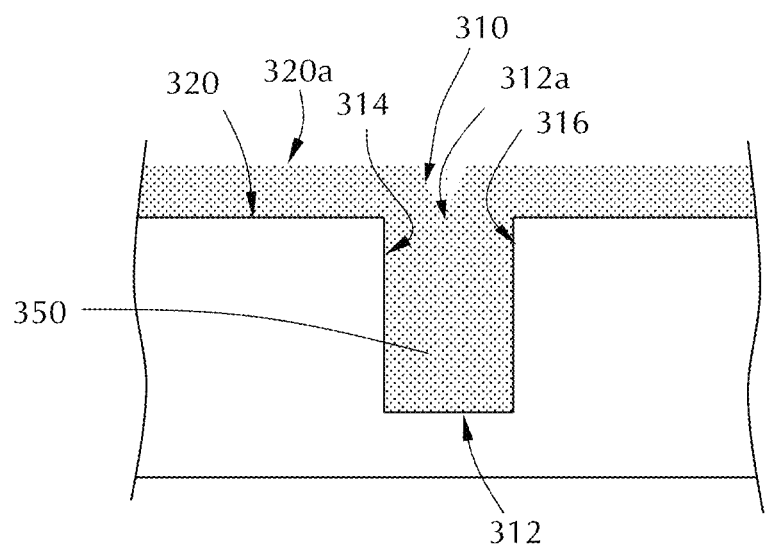

A gap-fill film 350 is shown in FIG. 8E where the gap 310 is substantially or completely filled by an $AlC_xO_yN_z$ film (x, y, and z are independently in the range of 0-3) and is free of voids or seams. Upon completion of the gap-fill film, the gap-filled substrate exits the deposition/etch loop to one or more optional post-processes 460.

Figure 8F:
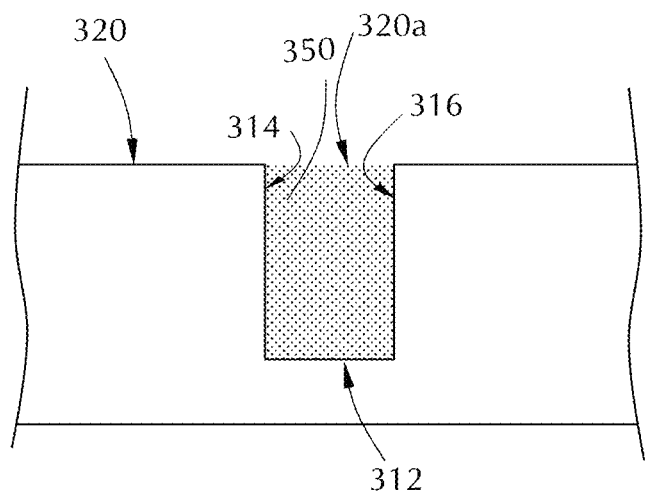

A cross-section view of a gap fill film 350 after post-processes 460 is shown in FIG. 8F where the portion the Al-containing film 330 deposited on the substrate surface 320 is removed and left only inside the gap.

Figure 10:
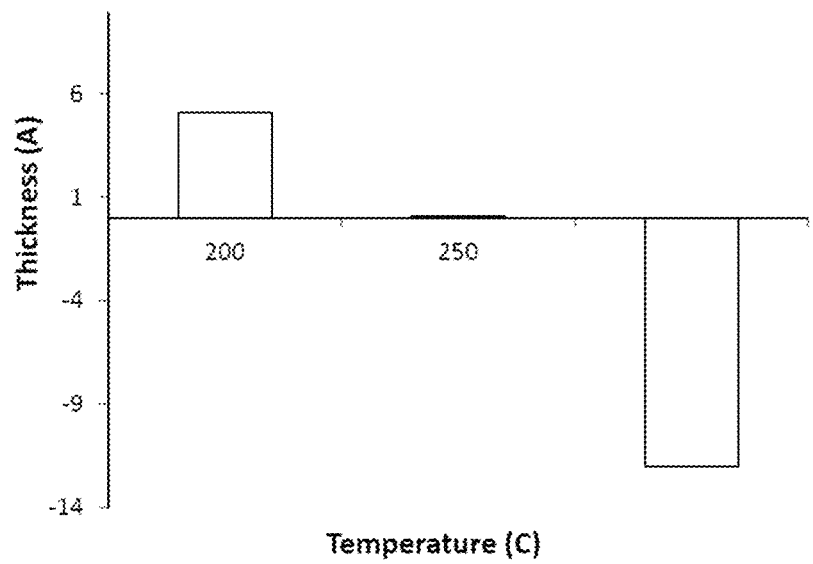
FIG. 10 shows a graph of thickness (Å) versus temperature (° C.) in accordance with one or more embodiments of the disclosure.

FIG. 10 shows a graph of thickness (Å) versus temperature (° C.) for an example where an $Al_2O_3$ film was etched using $NF_3$ plasma and TMA. 40 Å of AlO was etched at 200° C., 250° C., and 290° C. with TMA/$N_2$,$NF_3$ plasma. Pressure, % $NF_3$, number of cycles, and plasma power were 0.8 T, 10%, 30, and 50 W, respectively. According to FIG. 10, at 200° C. a film believed to be AlF was grown. At 250° C. there was no growth or etch, and at 290° C. there was an etch. These results show that the etch rate is dependent on temperature.

Figure 11:
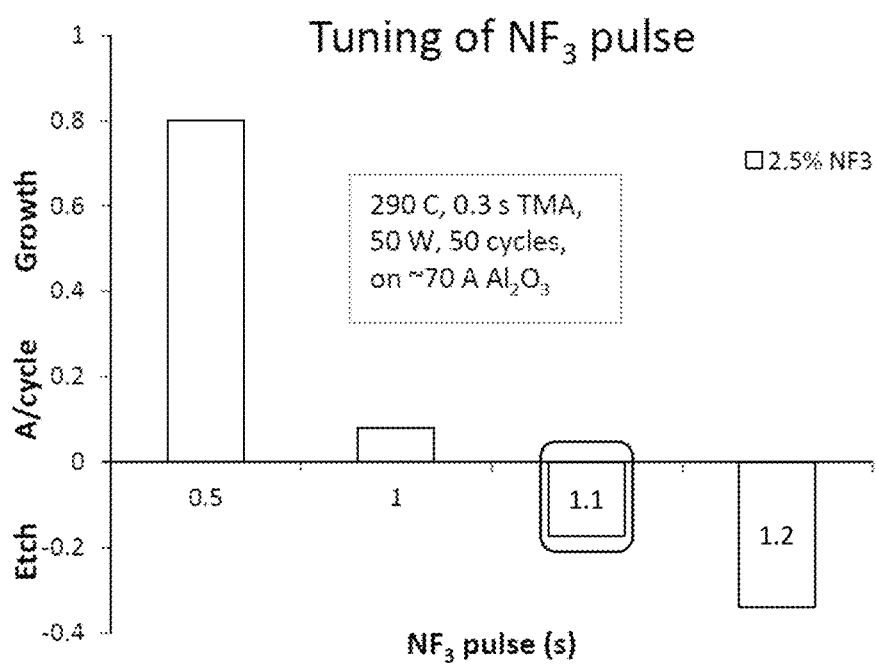
FIG. 11 shows a graph of the growth per cycle and etch in Å as a function of $NF_3$ pulse(s) in accordance with one or more embodiments of the disclosure.
Figure 12:
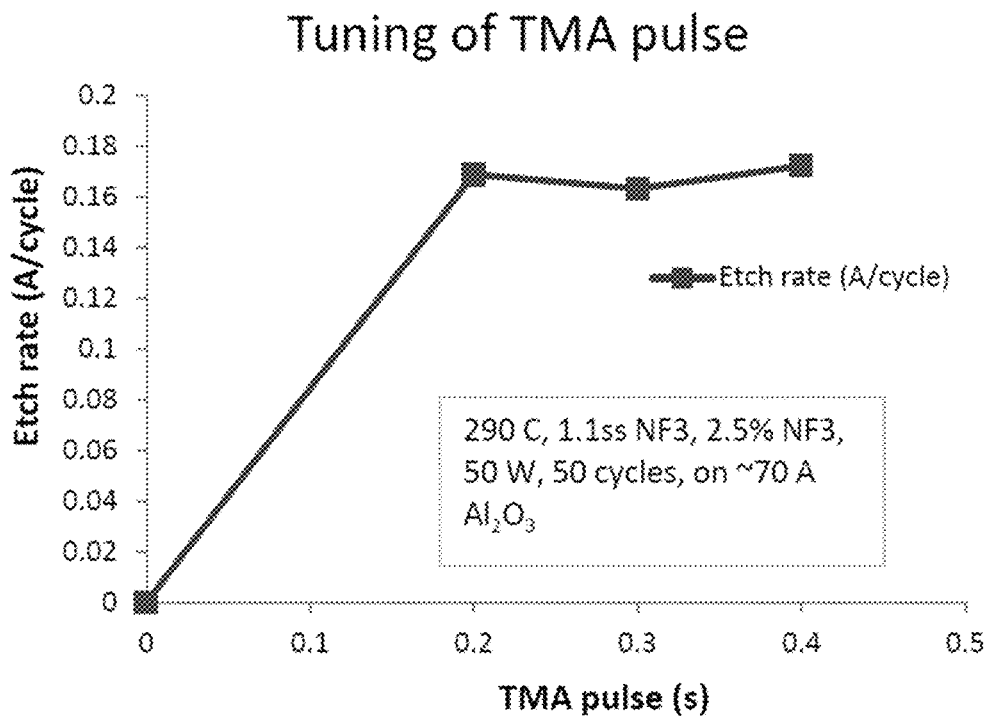
FIG. 12 show a graph of etch rate (Å/cycle) as a function of TMA pulse(s) in accordance with one or more embodiments of the disclosure.

The degree of fluorination depends on the aggressiveness of the $NF_3$ plasma treatment. By controlling the % $NF_3$, plasma power, $NF_3$ plasma pulse length, substrate temperature, and chamber pressure, the degree of fluorination can be controlled. The degree of surface fluorination may be minimized in order to achieve a more controlled etch process. If the degree of fluorination is not controlled, a large pulse of TMA may be used to convert all the AlF species to $AlF_x(CH_3)_y$ species and TMA pulse may not saturate until a very large TMA pulse is given. As shown in FIG. 11, at 2.5% of $NF_3$, increasing $NF_3$ plasma pulse increased the etch rate. FIG. 12 shows that TMA pulse can be saturated with 2.5% $NF_3$ and at 0.2 seconds TMA pulse.

Figure 13:
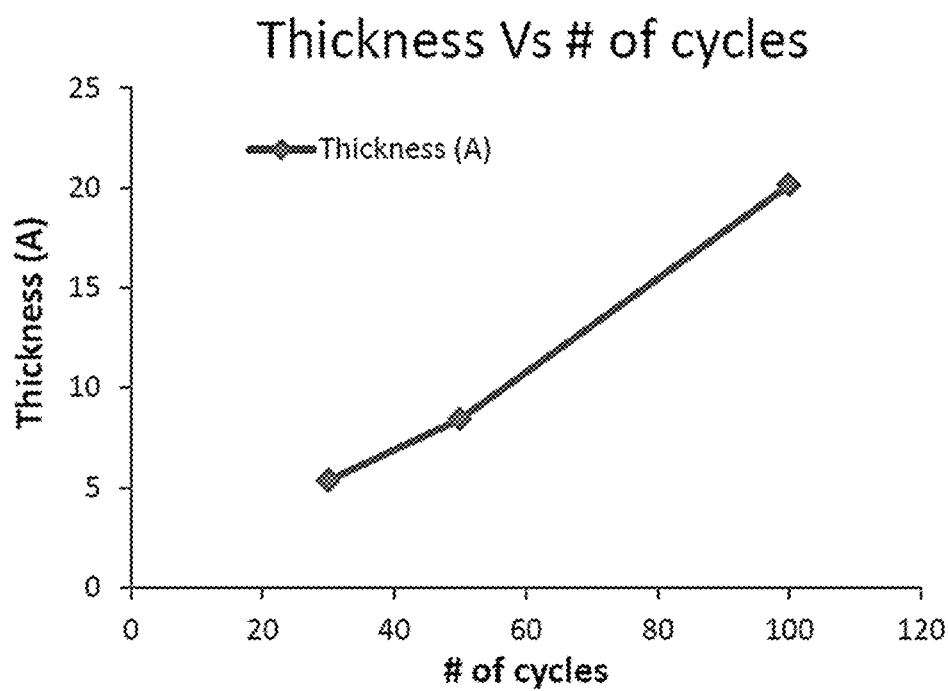
FIG. 13 shows a graph of thickness (Å) as a function of number of cycles in accordance with one or more embodiments of the disclosure.

FIG. 13 shows a graph of the etch thickness (Å) as a function of the number of deposition/etch cycles. Temperature, pressure, % $NF_3$, TMA pulse, and plasma power were 290° C., 0.8 T, 2.5%, 0.2 s, 50 W, respectively. As shown in FIG. 13, the etched thickness increased linearly with increasing number of cycles.

Figure 14A:
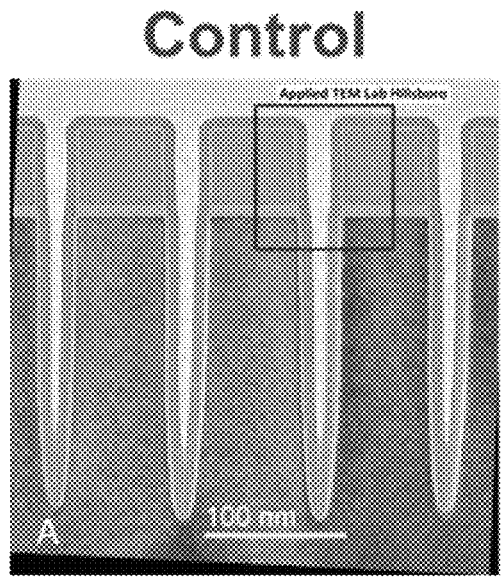
FIGS. 14A-B provide scanning electron microscopy (SEM) images of a 10:1 aspect ratio structure have a trench feature serving as a control example.
Figure 14B:
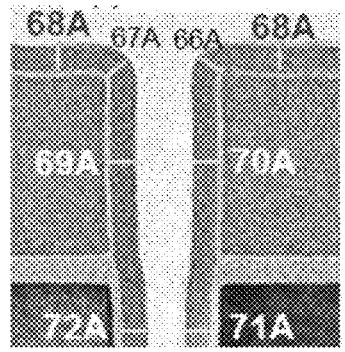

FIGS. 14A-B provide scanning electron microscopy (SEM) images of a 10:1 aspect ratio structure having a trench feature serving as a control example. A film of $Al_2O_3$ having thickness of ~73 Å was deposited by ALD using TMA and $H_2O$ as precursors at a temperature of 290° C. and a pressure 0.8 Torr. The deposited film was substantially conformal with a side/top ratio of ~0.96.

Figure 15A:
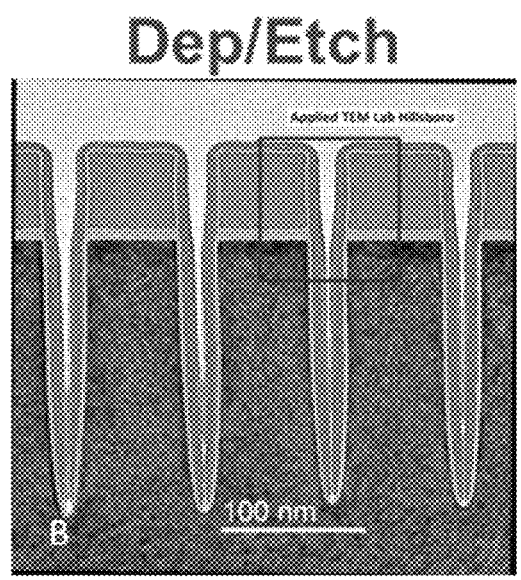
FIGS. 15A-B provide scanning electron microscopy (SEM) images of a 10:1 aspect ratio structure having a trench feature after performing a number of cycles in accordance with one or more embodiments of the disclosure.
Figure 15B:
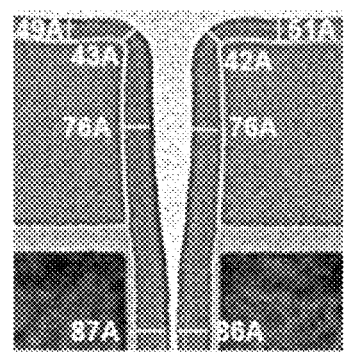

FIGS. 15A-B provide scanning electron microscopy (SEM) images of a 10:1 aspect ratio structure having a trench feature after performing one hundred (deposition)a→(etch)b cycles where a=1 and b=1. Deposition component was done with TMA and $H_2O$ and the etching was performed with $NF_3$ plasma followed by TMA. The temperature was 290° C. and the pressure was 0.8 T during the process. It is clear that the addition of an etch component affords non-conformal growth along the trench. The side/top ratio was ~0.67, indicating that the deposited film was much less conformal than for the control (FIGS. 14A-14B).

Accordingly, one or more embodiments of the disclosure are directed to processing methods utilizing a batch processing chamber like that shown in FIG. 5. A substrate 60 is placed into the processing chamber which has a plurality of regions 250a-h, each region separated from adjacent region by a gas curtain 150. At least a portion of the substrate surface is exposed to a first process condition in a first processing region 250a of the processing chamber. The first process condition of some embodiments comprises an aluminum-containing precursor.

The substrate surface is laterally moved through a gas curtain 150 to a second processing region 250b of the processing chamber. The substrate surface is exposed to a second process condition in the second processing region 250b. The second process condition of some embodiments comprises a reactant to form a film with the aluminum-containing precursor represented by $AlC_xO_yN_z$, wherein x, y, and z are independently in the range of 0-1.

The substrate surface is laterally moved through a gas curtain 150 to a third region 250c of the processing chamber. The substrate surface can then be exposed to a third process condition in the third region 250c. The third process condition of some embodiments comprises a fluorinating agent that reacts with the $AlC_xO_yN_z$ film to form $AlF_3$.

The substrate surface is laterally moved through a gas curtain 150 to a fourth region 250d of the processing chamber. The substrate surface can then be exposed to a fourth process condition in the fourth region 250d. The fourth process condition of some embodiments comprises an etchant that reacts with the $AlF_3$ to make volatile species for removal.

In some embodiments, the substrate is exposed to additional first and second process conditions to form a film with a predetermined film thickness. In some embodiments, the substrate is exposed to additional third and fourth process conditions to repeated etch the substrate surface.

Optionally, the substrate surface is laterally moved through a gas curtain 150 to a fifth region 250e of the processing chamber. The substrate surface can then be exposed to a fifth process condition in the fifth region 250e. The fifth process condition of some embodiments comprises an oxidizing agent that reacts with Al—F bonds to make Al—O bonds.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be taken to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising depositing an aluminum-containing gap-fill film in a bottom-up manner in a feature of a substrate surface, the feature having a bottom surface, a top surface and sidewalls extending a depth from the top surface to the bottom surface, the feature having a width defined by a first sidewall and a second sidewall, wherein depositing the aluminum-containing gap-fill film in the bottom-up manner includes conformally depositing an aluminum-containing gap-fill film on the substrate surface and the first sidewall, second sidewall and bottom surface of the feature; and non-conformally etching the aluminum-containing gap-fill film deposited on the substrate surface by exposing the aluminum-containing gap-fill film to a fluorinating agent to form an aluminum fluoride species concentrated near the top surface of the feature and exposing the aluminum-containing gap-fill film and aluminum fluoride species to an etchant to etch a portion of the aluminum-containing gap-fill film near the top surface of the feature at a higher etch rate than the aluminum-containing gap-fill film at the bottom surface of the feature.

2. The processing method of claim 1, wherein
non-conformally etching the aluminum-containing gap-fill film deposited on the substrate surface comprises sequentially exposing the aluminum-containing gap-fill film to an aluminum-containing precursor, a reactant, the fluorinating agent, and an etchant; or to a reactant, an aluminum-containing precursor, the fluorinating agent, and an etchant.

3. The processing method of claim 2, further comprising repeating forming the aluminum-containing gap-fill film by depositing the aluminum-containing gap-fill film and non-conformally etching the aluminum-containing gap-fill film deposited on the substrate surface until the aluminum-containing gap-fill film is formed, such that the depth and width of the feature is filled without voids.

4. The processing method of claim 2, wherein the aluminum-containing gap-fill film has a thickness in a range of about 10 Å to about 10000 Å.

5. The processing method of claim 2, wherein the aluminum-containing gap-fill film comprises a species according to $AlC_xO_yN_z$, wherein x, y, and z are independently in a range of 0-3.

6. The method of claim 5, wherein y is 0.

7. The processing method of claim 2, wherein the aluminum-containing precursor comprises an alkyl-containing aluminum compound, and aluminum alkoxide-based compound, an aluminum amino-based compound, an aluminum halide, or combinations thereof.

8. The processing method of claim 7, wherein the fluorinating agent comprises $WF_6$, $NF_3$ plasma, $NbF_5$, $XeF_2$, $F_2$, $TiF_4$, hydrogen fluoride (HF), pyridine-HF, alkylamine-HF, a metal fluoride, or combinations thereof.

9. The processing method of claim 8, wherein the etchant comprises one or more of:
R'$_3$Al, where R' is an alkyl, an amine, or combinations thereof;
Sn(R")$_2$, where R" is acetylacetone (acac), hexafluoroacetylacetone, or combinations thereof;
Sn(R'")$_4$, where R'" is an alkyl, an amine, an ether, or combinations thereof; and
Sn(R"")$_2$, where R"" is a cyclopentadienyl (Cp)-based ligand.

10. The processing method of claim 2, wherein the aluminum-containing precursor comprises trimethylaluminum (TMA), the fluorinating agent comprises $NF_3$ plasma, and the etchant comprises trimethylaluminum (TMA).

11. The processing method of claim 1, wherein the feature has an aspect ratio of greater than or equal to 5:1, wherein the aspect ratio comprises a ratio of a depth of the feature to a width of the feature.

12. The processing method of claim 1, wherein the aluminum-containing gap-fill film is free of voids or seams.

13. A processing method comprising:
positioning a substrate surface in a processing chamber, the substrate surface having at least one feature thereon, the at least one feature creating a gap with a bottom surface, a top surface and sidewalls;
exposing the substrate surface to an aluminum-containing precursor and a reactant to form a conformal aluminum-containing gap-fill film on the feature;
exposing the conformal aluminum-containing gap-fill film on the feature to a fluorinating agent and an etchant to preferentially etch a portion of the conformal aluminum-containing gap-fill film at a higher etch rate at the top surface of the feature relative to the bottom surface of the feature by forming an aluminum fluoride species concentrated more near the top surface of the feature to etch the portion of the aluminum-containing gap-fill film near the top surface of the feature at a higher etch rate than the aluminum-containing gap-fill film at the bottom surface of the feature;
exposing the conformal aluminum-containing gap-fill film on the feature to an oxidizing agent after the preferential etch; and
repeating sequential exposure to the aluminum-containing precursor and reactant followed by exposure to the fluorinating agent and etchant and optional oxidizing agent to fill the gap of the feature in a bottom-up manner.

14. The processing method of claim 13, wherein the fluorinating agent comprises a plasma.

15. The processing method of claim 14, wherein the plasma is a directional plasma.

16. The processing method of claim 13, wherein etching the conformal aluminum-containing gap-fill film after sequentially exposing the substrate surface to the aluminum-containing precursor and the reactant occurs in a range of one to about 10000 times.

17. The processing method of claim 13, wherein the substrate surface is exposed sequentially to the fluorinating agent and etchant prior to each sequential exposure to the aluminum-containing precursor and reactant, and the method includes non-conformally etching the conformal aluminum-containing gap-fill film on the substrate surface by concentrating more fluorination molecules near the top surface of the feature to etch the top surface of the feature at a higher etch rate than the bottom surface.

18. A processing method comprising:
placing a substrate having a substrate surface into a processing chamber comprising a plurality of sections, each section separated from adjacent sections by a gas curtain, the substrate surface having at least one feature with a top, bottom and sides and an aspect ratio of greater than or equal to 10:1, wherein the aspect ratio comprises a ratio of a depth of the feature to a width of the feature;
exposing at least a portion of the substrate surface to a first process condition in a first section of the processing chamber, the first process condition comprising an aluminum-containing precursor;
laterally moving the substrate surface through a gas curtain to a second section of the processing chamber;
exposing the substrate surface to a second process condition in the second section of the processing chamber, the second process condition comprising a reactant to form on the feature a conformal aluminum-containing gap-fill film with the aluminum-containing precursor, the aluminum-containing gap-fill film comprising a species according to $AlC_xO_yN_z$, wherein x, y, and z are independently in a range of 0-3;
laterally moving the substrate surface with the aluminum-containing gap-fill film on the feature through a gas curtain to a third section of the processing chamber;
exposing the substrate surface with the aluminum-containing gap-fill film on the feature to a third process condition in the third section of the processing chamber, the third process condition comprising a fluorinating agent to form an aluminum fluoride species concentrated more near the top of the feature than at the bottom of the feature;
laterally moving the substrate surface with the aluminum-containing gap-fill film on the feature through a gas curtain to a fourth section of the processing chamber;
exposing the substrate surface with the aluminum-containing gap-fill film on the feature to a fourth process condition in the fourth section of the processing chamber, the fourth process condition comprising an etchant to preferentially etch at a higher etch rate at the top of the feature relative to the bottom of the feature by etching the aluminum-containing gap-fill film at the top of the feature at a higher etch rate than the aluminum-containing gap-fill film at the bottom of the feature; and
optionally laterally moving the substrate surface with the film on the feature through a gas curtain to a fifth section of the processing chamber;
optionally exposing the substrate surface with the aluminum-containing gap-fill film on the feature to a fifth process condition in the fifth section of the processing chamber, the fifth process condition comprising an oxidizing agent; and
repeating exposure to the first section, second section, third section, fourth section, and optionally to the fifth section including lateral movement of the substrate surface to conformally fill the feature with the aluminum-containing gap-fill film.

19. The method of claim 18, wherein the aluminum-containing precursor comprises trimethylaluminum (TMA), the fluorinating agent comprises $NF_3$ plasma, and the etchant comprises trimethylaluminum (TMA).

20. The method of claim 18, wherein the aluminum-containing gap-fill film comprises AlO or AlN, and the method includes non-conformally etching the aluminum-containing gap-fill film on the substrate surface by concentrating more aluminum fluoride species near the top of the feature to etch a portion of the aluminum-containing gap-fill near the top of the feature at a higher etch rate than the aluminum-containing gap-fill at the bottom of the feature.

\* \* \* \* \*